United States Patent
Kozicki et al.

(10) Patent No.: US 10,466,969 B2
(45) Date of Patent: Nov. 5, 2019

(54) TUNABLE TRUE RANDOM NUMBER GENERATOR USING PROGRAMMABLE METALLIZATION CELL(S)

(71) Applicants: ARIZONA BOARD OF REGENTS ON BEHALF OF ARIZONA STATE UNIVERSITY, Scottsdale, AZ (US); Nad Gilbert, Gilbert, AZ (US)

(72) Inventors: Michael Kozicki, Phoenix, AZ (US); Nad Gilbert, Gilbert, AZ (US)

(73) Assignees: Arizona Board of Regents on behalf of Arizona State University, Scottsdale, AZ (US); Nad Gilbert, Gilbert, AZ (US)

( * ) Notice: Subject to any disclaimer, the term of this patent is extended or adjusted under 35 U.S.C. 154(b) by 0 days.

(21) Appl. No.: 15/973,887

(22) Filed: May 8, 2018

(65) Prior Publication Data
US 2018/0321913 A1    Nov. 8, 2018

Related U.S. Application Data

(60) Provisional application No. 62/503,012, filed on May 8, 2017.

(51) Int. Cl.
*G06F 7/58*    (2006.01)
*G11C 13/00*    (2006.01)

(52) U.S. Cl.
CPC .......... *G06F 7/588* (2013.01); *G11C 13/0011* (2013.01)

(58) Field of Classification Search
None
See application file for complete search history.

(56) References Cited

U.S. PATENT DOCUMENTS

| 5,761,115 | A  | 6/1998 | Kozicki et al. |
| 5,896,312 | A  | 4/1999 | Kozicki et al. |
| 5,914,893 | A  | 6/1999 | Kozicki et al. |
| 6,084,796 | A  | 7/2000 | Kozicki et al. |
| 6,388,324 | B2 | 5/2002 | Kozicki |
| 6,418,049 | B1 | 7/2002 | Kozicki et al. |

(Continued)

FOREIGN PATENT DOCUMENTS

| CA | 2261639 C | 2/2002 |
| CN | 1144231 C | 3/2004 |

(Continued)

OTHER PUBLICATIONS

Kiaoming Chen, Lin Wang, Boxun Li,Yu Wang, Xin Li,Yongpan Liu, and Huazhong Yang, "Modeling Random Telegraph Noise as a Randomness Source and its Application in True Random Number Generation" IEEE Transactions Intergrated Circuits and Systems, vol. 35, No. 9, 1435-1448 Sep. 2016.

(Continued)

*Primary Examiner* — David H Malzahn
(74) *Attorney, Agent, or Firm* — Michael Best & Friedrich LLP (57) ABSTRACT

Random number generator systems and method for tuning a randomness characteristic of the system are described. The random number generator system includes at least one programmable metallization cell (PMC) device and is configured to provide a random output word based on random telegraph noise caused by the at least one PMC device.

16 Claims, 5 Drawing Sheets

(56) References Cited

U.S. PATENT DOCUMENTS

| | | | |
|---|---|---|---|
| 6,438,106 B1* | 8/2002 | Pillar | H04L 12/5602 370/232 |
| 6,469,364 B1 | 10/2002 | Kozicki | |
| 6,487,106 B1 | 11/2002 | Kozicki | |
| 6,635,914 B2 | 10/2003 | Kozicki et al. | |
| 6,798,692 B2 | 9/2004 | Kozicki et al. | |
| 6,825,489 B2 | 11/2004 | Kozicki | |
| 6,865,117 B2 | 3/2005 | Kozicki | |
| 6,914,802 B2 | 7/2005 | Kozicki | |
| 6,927,411 B2 | 8/2005 | Kozicki | |
| 6,940,745 B2 | 9/2005 | Kozicki | |
| 6,985,378 B2 | 1/2006 | Kozicki | |
| 6,998,312 B2 | 2/2006 | Kozicki et al. | |
| 7,006,376 B2 | 2/2006 | Kozicki | |
| 7,101,728 B2 | 9/2006 | Kozicki et al. | |
| 7,142,450 B2 | 11/2006 | Kozicki et al. | |
| 7,145,794 B2 | 12/2006 | Kozicki | |
| 7,169,635 B2 | 1/2007 | Kozicki | |
| 7,180,104 B2 | 2/2007 | Kozicki | |
| 7,227,169 B2 | 6/2007 | Kozicki | |
| 7,288,781 B2 | 10/2007 | Kozicki | |
| 7,294,875 B2 | 11/2007 | Kozicki | |
| 7,372,065 B2 | 5/2008 | Kozicki et al. | |
| 7,385,219 B2 | 6/2008 | Kozicki et al. | |
| 7,402,847 B2 | 7/2008 | Kozicki et al. | |
| 7,405,967 B2 | 7/2008 | Kozicki et al. | |
| 7,560,722 B2 | 7/2009 | Kozicki | |
| 7,675,766 B2 | 3/2010 | Kozicki | |
| 7,728,322 B2 | 6/2010 | Kozicki | |
| 7,763,158 B2 | 7/2010 | Kozicki | |
| 7,929,331 B2 | 4/2011 | Kozicki | |
| 8,022,384 B2 | 9/2011 | Kozicki | |
| 8,134,140 B2 | 3/2012 | Kozicki | |
| 8,213,217 B2 | 7/2012 | Kozicki | |
| 8,213,218 B2 | 7/2012 | Kozicki | |
| 8,218,350 B2 | 7/2012 | Kozicki | |
| 8,345,910 B2 | 1/2013 | Chae et al. | |
| 9,165,644 B2 | 10/2015 | Kamalanathan et al. | |
| 10,153,729 B2 | 12/2018 | Kumar et al. | |
| 2003/0107105 A1 | 6/2003 | Kozicki | |
| 2004/0124407 A1 | 7/2004 | Kozicki et al. | |
| 2005/0225413 A1 | 10/2005 | Kozicki et al. | |
| 2006/0238185 A1 | 10/2006 | Kozicki | |
| 2006/0291364 A1 | 12/2006 | Kozicki | |
| 2009/0259705 A1* | 10/2009 | Kailas | G06F 7/58 708/255 |
| 2013/0220413 A1 | 8/2013 | Kozicki et al. | |
| 2014/0136583 A1* | 5/2014 | Hyde | G06F 7/588 708/250 |
| 2014/0172762 A1 | 6/2014 | Suri et al. | |
| 2016/0028544 A1* | 1/2016 | Hyde | H04L 9/0869 380/44 |
| 2016/0315763 A1* | 10/2016 | Hammon | H04L 9/065 |
| 2017/0317646 A1 | 11/2017 | Kumar et al. | |
| 2018/0321913 A1* | 11/2018 | Kozicki | G06F 7/588 |
| 2019/0182034 A1* | 6/2019 | McCarthy | H04L 9/0662 |

FOREIGN PATENT DOCUMENTS

| | | |
|---|---|---|
| EP | 939957 B1 | 8/2005 |
| KR | 100349927 B1 | 8/2002 |
| TW | 356549 B | 4/1999 |
| TW | 523745 B | 3/2003 |
| TW | I224403 B | 11/2004 |
| TW | I260629 B | 8/2006 |
| TW | I267893 B | 12/2006 |
| WO | 1997048032 A2 | 12/1997 |
| WO | 1999028914 A2 | 6/1999 |
| WO | 2000048196 A1 | 8/2000 |
| WO | 2002021542 A1 | 3/2002 |
| WO | 2002082452 A2 | 10/2002 |
| WO | 2002099517 A2 | 12/2002 |
| WO | 2003028098 A2 | 4/2003 |
| WO | 2003032392 A2 | 4/2003 |
| WO | 2003036735 A2 | 5/2003 |
| WO | 2003058638 A1 | 7/2003 |
| WO | 2003079463 A2 | 9/2003 |
| WO | 2005083810 A2 | 9/2005 |
| WO | 2005124788 A2 | 12/2005 |
| WO | 2009064577 A1 | 5/2009 |
| WO | 2012065076 A1 | 5/2012 |
| WO | 2018175973 A1 | 9/2018 |

OTHER PUBLICATIONS

R. Soni, P. Meuffels, A. Petraru, M. Weides, C. Kogeler, R. Waser, and H. Kohlstedt "Probing Cu doped Ge0.3Se0.7 based resistance switching memory devices with random telegraph noise" Journal of Applied Physics 107, 024517 (2010); View online: http://dx.doi.org/10.1063/1.3291132, Published by the AIP Publishing.

Chiu, Y-T., "A Memristor True Random-Number Generator: Noise in a compact resistive memory could bring true digits to low-power logic" IEEE Inside Technology http://spectrucm.ieee.org/semiconductors/memory/a-memristor-true- randomnumber-generator, Jul. 11,2019.

Gaba, S., "Resistive-RAM for Data Storage Applications", Dissertation for the degree of Doctor of Philosophy, University of Michigan 2014.

Karam, R. et al., "Security Primitive Design with Nanoscale Devices: A Case Study with Resistive RAM", 2016.

Kim, J. et al., "Nano-Intrinsic True Random Number Generation: A Device to Data Study", IEEE Transactions on Circuits and Systems-1: Regular Papers vol. 66, No. 7, Jul. 2019.

Kumar, S. et al., "Chaotic Dynamics in Nanoscale NbO2 Mott Memristors for Analogue Computing", Nature, vol. 548, 318-321, Aug. 2017.

Moore, S. et al., "Memristor-Driven Analog Compute Engine Would Use Chaos to Compute Efficiently", IEEE Spectrum, Oct. 2017 [retrieved on Jul. 23, 2019], retreived from the internet: <URL:https://spectrum.ieee.org/nanoclast/semiconductors/devices/memristordriven-analog-compute-engine-would-use-chaos-to-compute-efficiently>.

* cited by examiner

TUNABLE TRUE RANDOM NUMBER GENERATOR USING PROGRAMMABLE METALLIZATION CELL(S)

RELATED APPLICATIONS

This application claims the benefit of U.S. Provisional Patent Application No. 62/503,012, filed May 8, 2017, and entitled "TUNABLE TRUE RANDOM NUMBER GENERATOR USING PROGRAMMABLE METALLIZATION CELL(S)," the entire contents of which are incorporated herein by reference.

BACKGROUND

The present invention relates to systems and devices for generating random numbers that might be required for applications such as, for example, cryptography, secure transmissions, and direct encryption.

With the advent of the internet of things (IoT), internet security concerns have increased dramatically. A huge number of devices are currently communicating in open networks with little or no security. The possibility of network intrusion via this weakness, including distributed denial of service (DDoS) attacks, has sparked great interest in generating secure communications. Because most IoT devices are based on low power system-on-a-chip (SoC) designs to fit the operational requirements of IoT, full security approaches may benefit from solutions with little circuit overhead or additional power consumption.

Secure communications typically require random number generation to create a secure key. The security of the key is directly related to the randomness of the number generation. Various software approaches have been employed to generate pseudo random binary sequences (PRBS), but these can be cracked with sufficient computing power. Better sources of randomness are natural non-deterministic processes such as, for example, nuclear decay.

SUMMARY

Various embodiments of the invention provide a compact integratable and low-power true random number generator (TRNG) based on a natural entropic process. In some embodiments, the random number generated by the system is used in security solutions related to IoT devices.

In one embodiment, the invention provides a random number generator system that includes at least one programmable metallization cell (PMC) device. The random number generator system is configured to provide a random output word based on random telegraph noise caused by the at least one PMC device.

In another embodiment, the invention provides a method of tuning a random number generator system that includes at least one programmable metallization cell (PMC) and is configured to provide a random output word based on random telegraph noise caused by the at least one PMC. An output signal of the PMC (e.g., a signal indicative of a resistance or capacitance of the PMC device) is monitored and compared to certain predefined or otherwise determined tuning criteria. At least one characteristic of the bias voltage applied to the PMC is iteratively modulated until the output signal satisfies the tuning criteria. The characteristic of the bias voltage that is iteratively modulated can include an amplitude of the bias voltage, a polarity of the bias voltage, and/or a pulse application duration of the bias voltage (i.e., the time period for which the PMC device is exposed to the bias voltage in each iteration).

Other aspects of the invention will become apparent by consideration of the detailed description and accompanying drawings.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

A non-volatile memory device is a memory device that retains stored information even when electric power is not applied. A Programmable Metallization Cell (PMC) is a non-volatile resistive memory technology that operates using redox reactions to form and dissolve a conductive filament between an anode and a cathode. In some implementations, a PMC device is made of two solid metal electrodes. One electrode is formed of a relatively inert metal—such as, for example, tungsten, nickel, or aluminum—and the other electrode is formed of an electrochemically active metal—such as, for example, silver or copper. A thin film of solid electrolyte (e.g., chalcogenide glass) is positioned between the two electrodes.

A binary "1" is written to the PMC by applying a forward voltage bias is applied that exceeds a positive "write" threshold (e.g., a 0.5V pulse applied for 30-50 ns). This forward voltage bias causes a conductive metallic filament to form between the anode and the cathode thereby causing the PMC device to enter a "low resistance state" (LRS). Conversely, a binary "0" is written to the PMC device by applying a reverse voltage bias that exceeds a reverse "write" threshold (e.g., a −0.8V pulse applied for 30-50 ns). This reverse bias causes the conductive metallic filament to dissolve thereby causing the PMC device to enter a "high resistance state" (HRS).

To read the state of the PMC device, a low voltage pulse (i.e., a pulse at a positive voltage lower than the positive "write" voltage) is applied and the resulting current is compared to a reference value. The state of the PMC device is read as a binary "1" when the current of the PMC device exceeds the reference current and is read as a binary "0" when the current is less than the reference current.

A PMC device typically exhibits some form of random telegraph noise (RTN). This is caused by ions randomly hopping between trapping sites (i.e., potential wells) that are in different positions in the conduction pathway. This results in random discrete (high-low) variations in the fine-scale resistance or capacitance of the device. Because the "traps" are themselves randomly distributed in the ion conducting material of the cell (i.e., as a physical feature in the electrolyte layer), no two PMC devices will give the exact same RTN signal. Instead, the position and potential energy of each trap will be different in each device and, accordingly, the total time spent in one state or another (i.e., high or low) will differ from cell to cell.

Due to RTN, these PMC devices can generate a truly random signal in the conduction pathway through the device. In the examples described below, this random signal, which appears as switching between two resistance (or capacitance) states, is sensed and converted into digital values to be used as a true random number generator (TRNG). The TRNG output from the system can then be used, for example, for cryptography, secure transmissions, direct encryption, or other systems and applications that require a random number generator.

Figure 1:
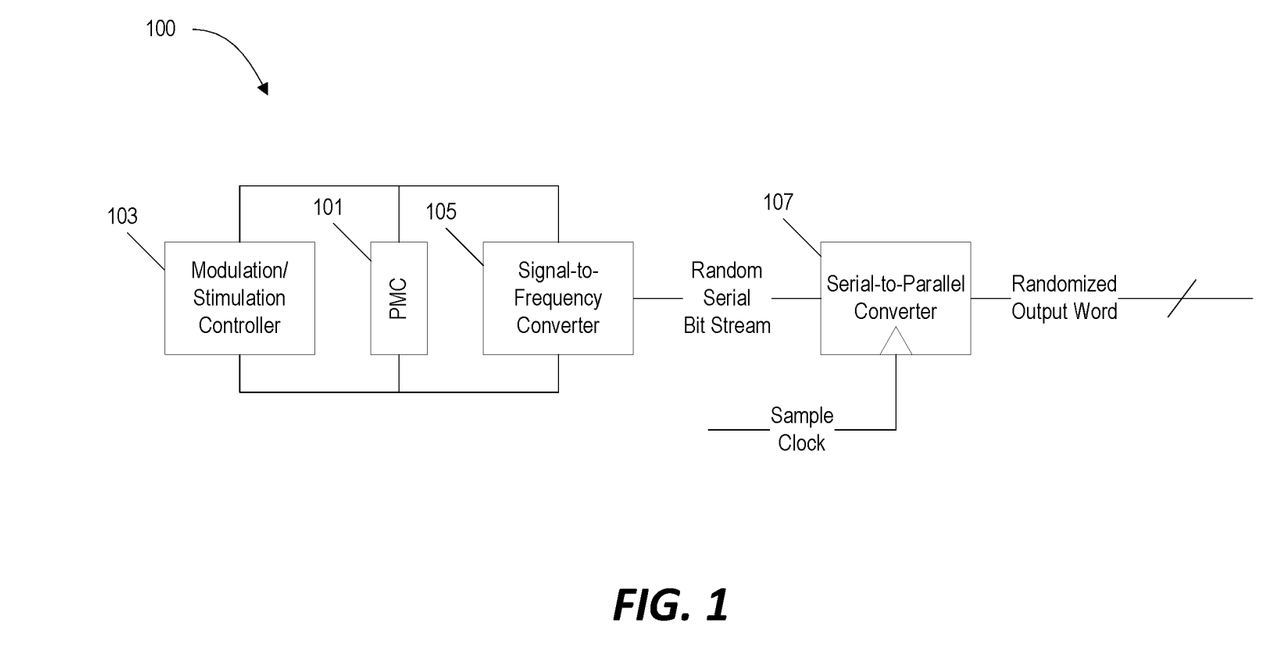
FIG. 1 is a schematic diagram of a true random number generator system using an individual programmable metallization cell.

FIG. 1 illustrates a first example of a true random number generator system 100 that utilizes a single PMC device 101. As discussed above, with an appropriate voltage stimulation, the PMC device 101 can generate a truly random signal (e.g., a change in resistance indicated by fluctuations in the current flowing) as a function of time. The entropy for the random signal arises from RTN caused by ions randomly hopping between trapping sites. To control the rate of random hopping events or, more specifically, to balance the total time spent in both the high and low states so that all devices produce similar random signals, the stimulation of the PMC is implemented with a feedback system.

In the example of FIG. 1, the feedback system includes a modulation/stimulation controller 103 that is configured to balance double-well potentials involved in RTN. In some implementations, the modulation/stimulation controller 103 includes a processor and a memory storing instructions that are executed by the processor to provide the functionality of the modulation/stimulation controller 103 (for example, a system controller for the device including the true random number generator 100). In other implementations, the modulations/stimulation controller 103 may be implemented by other programmable or non-programmable circuitry. In various implementations, the modulation/stimulation controller 103 may include one or more voltage sources, switches, and/or current sources.

Figure 2:
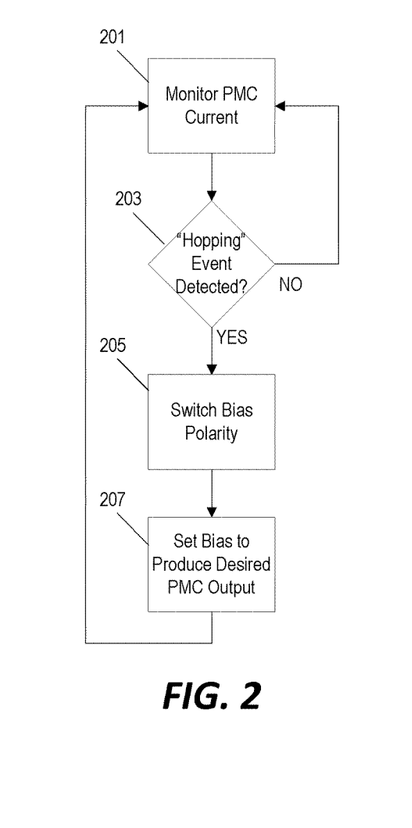
FIG. 2 is a flow chart of a method for using feedback to balance well potentials in the PMC device in the system of FIG. 1.

As illustrated in FIG. 2, the modulation/stimulation controller 103 monitors the current of the PMC 101 (step 201) to detect a "hopping" event. In response to detecting a "hopping" event (step 203), the modulation/stimulation controller 103 switches the polarity of the bias applied to the PMC 101 (step 205) and then sets the bias across the cell to produce the desired output (step 207). The measured value is the capacitance or resistance of the cell when it is in the balanced state.

The PMC device 101 can also be conditioned to implement a near-zero autocorrelation and the nonvolatile nature of the cell can be used to store this tuned state with the general location of the material. This tuning also achieves a near-zero autocorrelation with the bias source of the modulation/stimulation controller 103. This in effect calibrates for errors in the bias generator so that the RTN of the PMC is the true source of entropy in the random signal. The tuning of the PMC also reinforces its preferred state based on the original chaotic nature of the cell, which helps to stabilize the cell's output. Additional stimulation can be introduced in to the feedback, such as set or soak time, to improve the balancing of the potentials. A PMC bias generator—such as, for example, described in U.S. Pat. No. 7,514,706—can be used to generate complementary temperature biases to ensure the desired "balancing of the traps" is maintained over temperature variation.

The system 100 of FIG. 1 also includes a signal-to-frequency converter 105 that monitors the current of the PMC 101, which is indicative of fluctuations in resistance or capacitance due to RTN, and outputs a frequency signal based on the monitored current. The output frequency signal is a random serial bit stream based on the entropy of the RTN in the PMC 101. The random digital bit stream can then be used with various post-processing schemes to generate a digital word as the final output of the random number generator system 100. In the example of FIG. 1, the random digital bit stream is sampled by a serial-to-parallel converter 107 with a sample clock and a series of shift registers. At each clock cycle, a new bit from the random digital bit stream is stored to the shift register until all shift registers are used. After n clock cycles, the contents of the shift registers are stored in another set of registers as a digital word (where n is the number of shift registers in the serial-to-parallel converter 107 and the number of bits in the randomized output word). This sampling approach operates like a digital filter and, in other implementations, other digital filter techniques could be used to generate the random output word from the random serial bit stream.

The PMC device 101 of FIG. 1 can also be tuned to balance the well potentials for a desired randomness characteristic. As discussed above, most PMC devices can be operated to provide a random output due to RTN. However, the bit rate of the random output could be too slow or too fast for a particular application. Applying a tuning process to the PMC can effectively adjust the "rate" of random events (e.g., the random hopping events discussed above). By adjusting the rate of the random events, the PMC device is tuned to provide a random output stream with a bit rate that is appropriate for a specific application or usage. In some implementations, the tuning is accomplished using voltage-time algorithms. In this process, the well-balancing is tuned and stored within the cell because the filamentary growth in the PMC device is generally non-volatile—though locally it demonstrates RTN.

In some implementations, the tuning of the PMC device is performed by modulating the voltage and time exposure of the cell until the PMC device reaches a desired tuning state. Tuning algorithms can include, for example, ramped pulse approaches, high voltage exposure, long/short pulse durations, and local feedback. With the device tuned to the desired state, the non-volatile nature of the cell allows it to stay in that tuned state of randomness. In other words, the tuned random characteristics can be retained after the electrical stimulus has been removed so that the tuning only has to be performed once. Also, tuning allows the device to be tuned to a desired operation to enhance the source of entropy rather than rely on the processing of the device to create a source of entropy.

Figure 3:
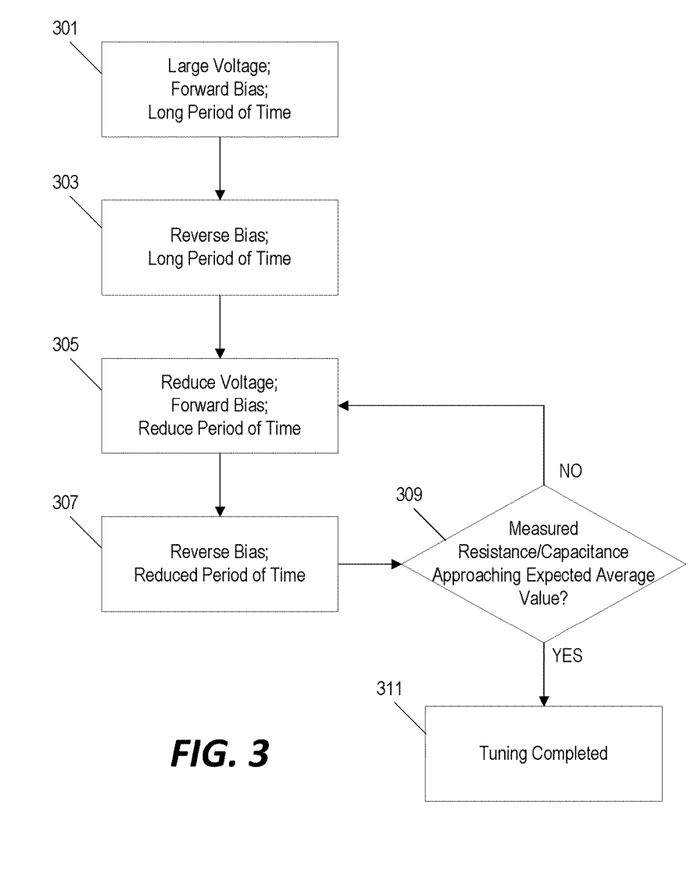
FIG. 3 is a flow chart of a method for tuning a PMC device for desired randomness characteristics by modulating a polarity of an applied bias voltage and iteratively decreasing a voltage magnitude and a pulse application duration of the applied bias voltage.

FIG. 3 illustrates a first example of a tuning algorithm that could be applied to the PMC device 101 in the system of FIG. 1 or to other PMC devices in other random number generator implementations. First, a forward biased voltage is applied to the PMC device for a defined period of time (step 301). A voltage magnitude is used that exceeds the normal program operation and is applied for a longer duration than is used for normal program operation. The polarity of the applied bias is then reversed (step 303). In this example, the magnitude of the voltage and the duration of the time period remains the same at this point, but, in other implementations, a different voltage magnitude and/or duration may be utilized.

After the expiration of this second time duration, the system reduces the voltage magnitude and applies the reduced voltage as a forward bias (step 305). The duration of the period of time for which the forward bias is applied is also reduced relative to the duration used in step 301. After the reduced period of time expires, the polarity of the applied bias voltage is reversed and the reverse bias voltage is applied to the PMC for the same reduced period of time (step 307). Again, in this example, the magnitude of the bias voltage used in step 307 is the same as the bias voltage applied at step 305 and the time duration at step 307 is the same as in step 305, but both voltage magnitude and time duration used in steps 305 and 307 are less than those used in steps 301 and 303. However, in other implementations, the voltage magnitude and/or the time duration used in step 307 may be different from those used in step 305.

After applying the reversed voltage for the reduced period of time at step 307, the system determines whether the measured resistance (or capacitance) of the PMC device is approaching an expected average value. If so, the tuning operation is completed (step 311). If not, steps 305 and 307 are repeated while continuing to reduce the magnitude of the voltage and the duration of the applied voltage at each iteration until the expected average resistance/capacitance value is reached (step 309).

Figure 4:
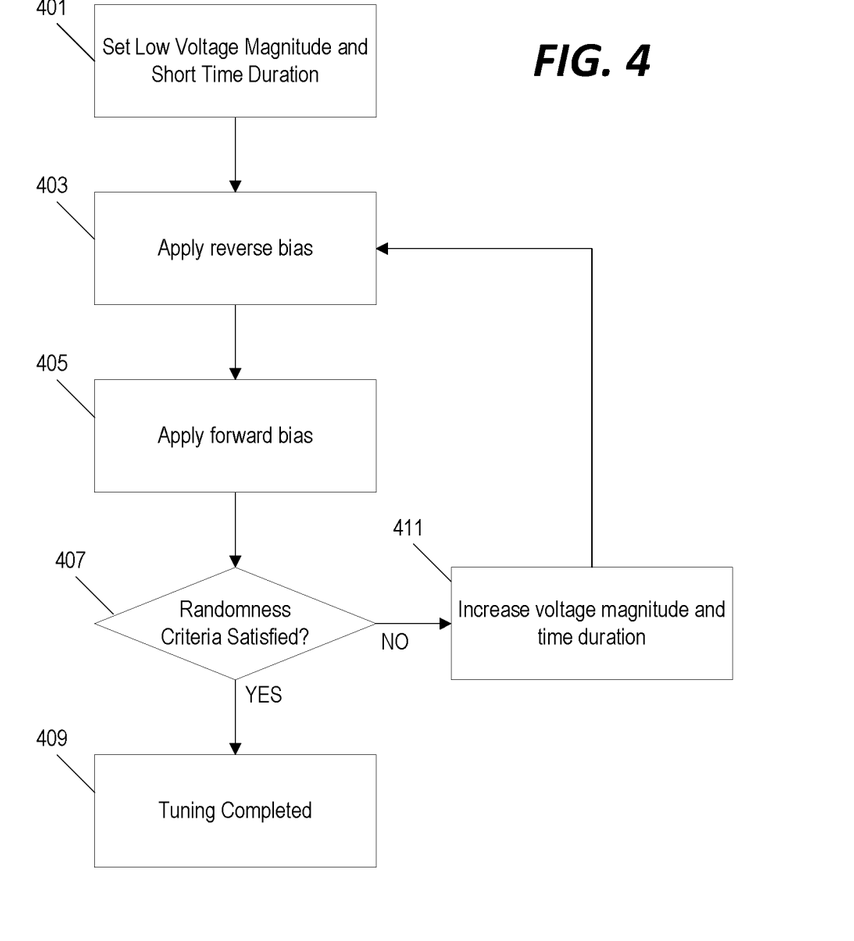
FIG. 4 is a flow chart of a method for tuning a PMC device for desired randomness characteristics by modulating a polarity of an applied bias voltage and iteratively increasing a voltage magnitude and a pulse application duration of the applied bias voltage.

FIG. 4 illustrates another example of a tuning algorithm. Whereas, in the example of FIG. 3, the tuning method begins with a relatively large voltage magnitude and pulse application duration that is iteratively decreased until a desired tuning state is reached, the tuning method of FIG. 4 iteratively increases the voltage magnitude and/or the pulse application duration until the desired tuning state is reached. In particular, the system starts by setting a low voltage amplitude and a short pulse application duration (step 401). The relatively low voltage amplitude is applied to the PMC device as a reverse bias voltage for the relatively short time duration (step 403) and then the polarity is reversed to apply the relatively low voltage amplitude as a forward bias voltage (step 405). After the forward bias voltage has been applied for the relatively short time duration, the system check to determine whether prescribed randomness criteria are satisfied (e.g., whether the average measured resistance or capacitance is at or near a defined or selected level) (step 407). If the randomness criteria are satisfied, then the tuning operation is complete (step 409). Otherwise, the voltage magnitude and/or the pulse application duration are iteratively increased (step 411) and applied as a reverse bias voltage (step 403) and then as a forward bias voltage (step 405) until the randomness criteria are satisfied (step 407).

Figure 5:
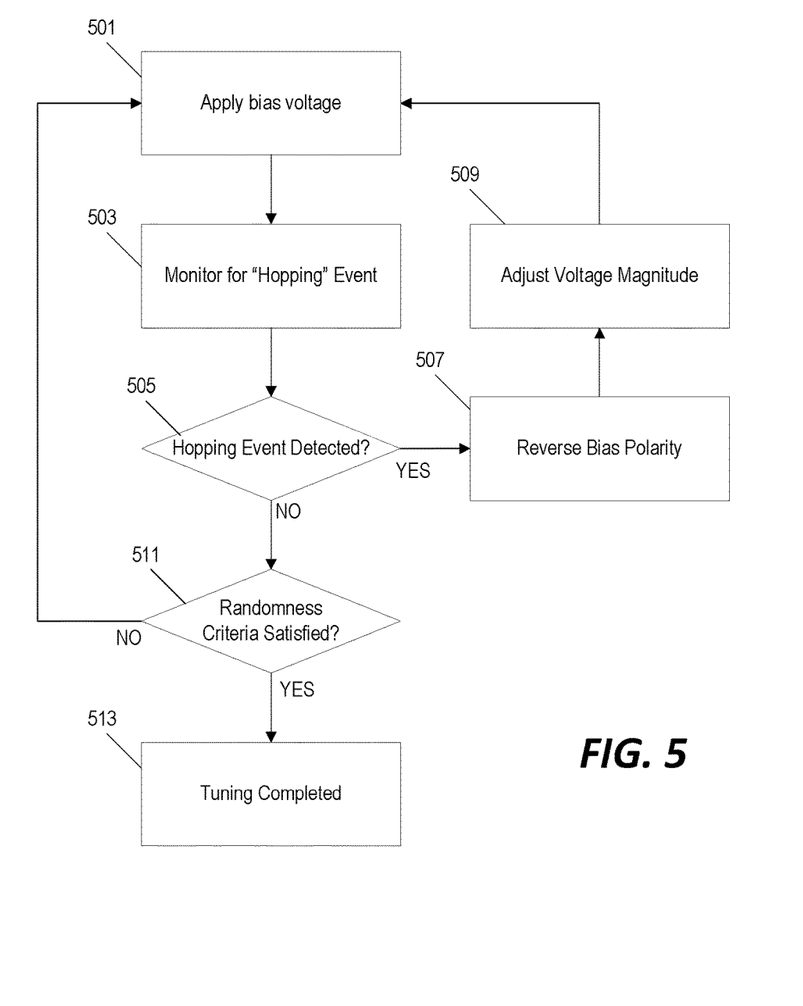
FIG. 5 is a flow chart of a method for tuning a PMC device for desired randomness characteristics by modulating a polarity of an applied bias voltage in response to detected "hopping" events in the PMC device.

As discussed above in reference to the example of FIG. 1, some implementations are configured to apply a feedback loop to balance the "wells" during operation of the PMC device. This type of well-balancing based on detected "hopping" events can also be adapted to tune the PMC device to a particular state. FIG. 5 illustrates an example of one such tuning algorithm. A bias voltage is applied (step 501) and the system monitors the PMC device for signals indicative of a "hopping" event (step 503). Each time a "hopping" event is detected (step 505), the system reverses the polarity of the applied bias voltage (step 507) and makes a corresponding adjustment to the magnitude of the applied bias voltage (step 509). This feedback operation is repeated until the system determines that a defined or determined randomness criteria are satisfied (step 511) which will end the tuning operation (step 513).

The precise details and settings of the tuning algorithms, such as those illustrated in FIGS. 3 through 5 may be adjusted or altered in various implementations—in some cases, to suit the particular needs and purposes of the random number generator system. For example, the system may be configured to begin by applying a maximum voltage level at step 501 of FIG. 5 and, in response to detecting a hopping event (step 505), the polarity of the bias voltage is reversed and the magnitude of the applied bias voltage is reduced (step 509). Alternatively, a system may be configured to begin by applying a minimum voltage level at step 501 and to iteratively increase the voltage magnitude each time a hopping event is detected. Similarly, in some implementations, the system may be configured to begin by applying a forward bias voltage while, in other implementations, the system may be configured to begin with a reverse bias voltage. Also, in some implementations, the system may be configured to delay for a defined period of time after detecting the hopping event before reversing the bias polarity and/or adjusting the voltage magnitude.

The test for randomness criteria can also be implemented differently in various different implementations. For example, the randomness criteria test of the tuning algorithm can include a counting of the number of ones and zeros in the output signal over the course of a defined period of time, a cumulative sums analysis, a frequency analysis, or another test/metric.

In some implementations, a tuning algorithm (such as illustrated in FIGS. 3 through 5) may be implemented by a system controller that includes a processor and a memory storing instructions that are executed by the processor to control the functionality of the system. For example, in the system 100 of FIG. 1, the modulation/stimulation controller 103 and/or the signal-to-frequency converter 105 may be configured to provide the functionality of a tuning algorithm. Also, due to the non-volatile nature of the PMC device, in some implementations, the PMC device tuning can be applied by an external system and the selectively connectable to the PMC device specifically for tuning.

The true random number generator systems and techniques described herein can be adapted to various other resistive memory devices that operate based on ion transport and redox processes. However, in some implementations, a material system may be selected that is compatible with standard CMOS logic fabrication processes. This will allow for integration into a logic circuit or, for example, a system-on-a-chip (SoC) used in Internet-of-things (IoT) devices. For example, Cu—$SiO_2$ PMC elements may be used in some implementations as these materials are widely used in semiconductor manufacturing and the devices are compact and low power.

In some implementations, the precise voltages and times used in the tuning algorithm (such as those described above in reference to FIGS. 3 through 5) could be determined based on the materials chosen to implement the PMC device. For example, a tuning algorithm for a Cu—$SiO_2$ PMC device might be designed to begin by exposing the cell to a voltage pulse of an amplitude between 2V and 5V with a pulse width between 1 ms and 10 ms. In this example, voltage polarities are given as an anode voltage minus the cathode voltage where both voltages are with respect to the system ground, zero potential. The bias voltage is then adjusted to expose the cell to a voltage pulse with an amplitude between −2V and −5V with a pulse width between 1 µs and 10 µs. The bias voltage is then modulated between voltage pulses with an amplitude between 0.5V and 2V and a pulse width between 10 ns and 1 µs and voltage pulses with an amplitude between −0.5V and −2V and a pulse width between 10 ns and 1 µs. This modulation is repeated for two to twenty iterations while, in some implementations, continuing to reduce the amplitude and/or pulse width for subsequent iterations, until the resistance or capacitance approaches the expected average value or another randomness test is satisfied.

Although the examples illustrated above provide a random number generator system using an individual PMC device, the techniques and systems—including the tuning of randomness characteristics—can also be applied to PMC device in an array. Each cell in the array would be tuned to place them into an entropic state. These states will be randomly entropic with respect to the other PMC devices in the array which will add to the random signal. In some implementations, the array is organized to have a number of PMC devices corresponding to the number of bits in the random output word. Accordingly, the random output word would be output directly from the array in parallel instead of requiring a sampling of a serial bit stream. In some implementations, a PMC memory array can be adapted to selectively or permanently provide the random number generator function.

Figure 6:
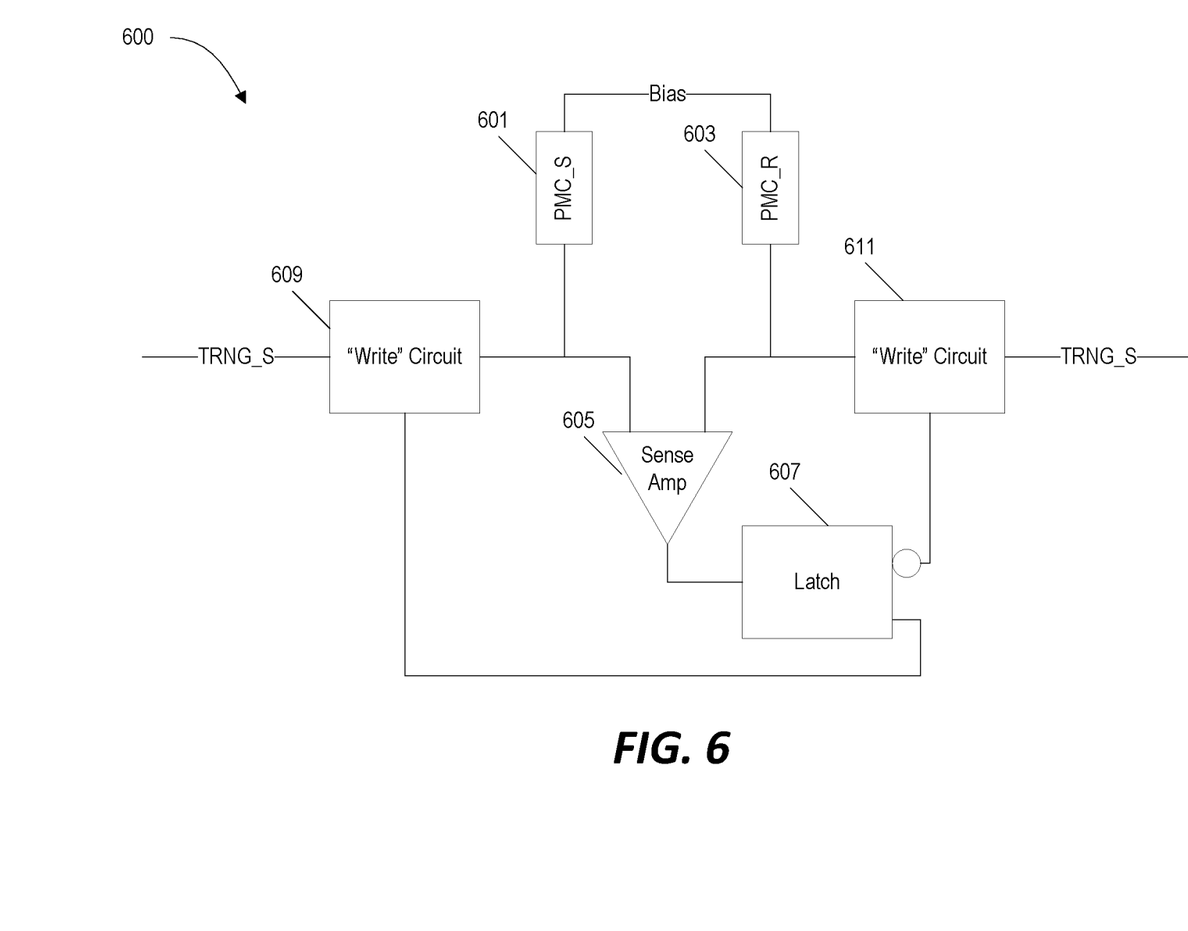
FIG. 6 is a schematic diagram of a true random number generator system using an array of programmable metallization cells.

FIG. 6 illustrates an example of a PMC array-based implementation of true random number generator system 600. A bias voltage is applied to a PMC sense terminal 601 and a PMC reference terminal 603. The output current of the PMC device 601 is compared to a reference signal 603 by a sense amplifier 605. The output of the sense amplifier 605 is then used as one bit of the random output word generated by the array. The latch 607 and the "write" circuits 609, 611 can, in some implementations, be configured to hard write the value of the output bit into the cell of the PMC device so that the same PMC array that is used to generate the random output word also provides non-volatile memory storage of the generated random number. To generate another random number, the cells of the PMC array would be controllably tuned back into the entropic state.

In some implementations, similar tuning algorithms as those discussed above in reference to FIGS. 3 through 5 can also be applied to PMC devices in an array implementation. However, the random output word generated by the array-based system 600 is provided directly as a one-time parallel operation rather than implemented as an oscillatory system that provides its output as a serial bit stream. In the example of FIG. 6, the write circuits 609, 611 can be configured to perform the tuning function and the output of the sense amplifier (SA) can be used for feedback to the tuning control for the implemented tuning algorithm.

Furthermore, because a PMC array-based implementation includes a plurality of memory units, the device can be configured in some implementations such that some of the PMC devices in the array (i.e., a first subset) are configured for use as a random number generator while other PMC devices in the array (i.e., a second subset) are configured for use as memory storage cells.

Unlike other random number generators that may be entirely dependent on the fabrication process of the entropy source, the entropy characteristics of a tunable PMC TRNG, such as those described above, can be manipulated through stimulation and tuning stored through its non-volatile properties. Accordingly, the resulting system is less dependent on close controls on entropy.

Although the examples discussed above focus on tuning the PMC by iteratively varying an electrical stimulus, in other implementations, the device may be configured to be tuned by varying another stimulus, for example, varying a thermal stimulus or an optical stimulation. In some implementations, temperature can also be used to control the entropy of the cell and, therefore, the rate and quality of its random output.

Also, although the examples discussed above focus primarily on tuning the PMCs to be used for random number generation. In some implementations, the devices/systems implementing the PMC-based true random number generator are further configured to monitor performance of the random number generator after it has been tuned. For example, the system may be configured to monitor performance of the random number generator over time and over changes/variations in temperature. This collected/monitored performance information can then be used as feedback to optimize future tuning operations. For example, a tuning system may be configured to implement machine learning processes (e.g., neural networks) to optimize the tuning performance using the collected performance data as "training" data for the machine learning process.

Thus, the invention provides, among other things, a tunable true random number generator using programmable metallization cells and methods for tuning/operating the same. Various features and advantages of the invention are set forth in the following claims.

What is claimed is:

1. A method of tuning a random number generator system to adjust a randomness characteristic, the random number generator system including at least one programmable metallization cell (PMC) and configured to provide a random output word based on random telegraph noise caused by the at least one PMC, the method comprising:
monitoring an output signal of the PMC;
determining whether the output signal satisfies tuning criteria; and
iteratively modulating at least one characteristic of a bias voltage applied to the PMC until the output signal satisfies the tuning criteria, wherein the at least one characteristic of the bias voltage is selected from a group consisting of an amplitude of the bias voltage, a polarity of the bias voltage, and a pulse application duration of the bias voltage.

2. The method of claim 1, wherein monitoring the output signal of the PMC includes monitoring a signal indicative of a resistance of the PMC, and wherein determining whether the output signal satisfies the tuning criteria includes determining that an average value of the signal indicative of the resistance is approaching an expected average value.

3. The method of claim 1, wherein iteratively modulating the at least one characteristic of the bias voltage applied to the PMC includes reversing the polarity of the bias voltage upon expiration of a pulse application duration.

4. The method of claim 1, wherein iteratively modulating the at least one characteristic of the bias voltage includes:
applying a first bias voltage of a first voltage magnitude for a first pulse application duration;

applying a second bias voltage of the first voltage magnitude with a polarity opposite a polarity of the first bias voltage for a second pulse application duration upon expiration of the first pulse application duration;

applying a third bias voltage of a second voltage magnitude with a polarity opposite the polarity of the second bias voltage for a third pulse application duration upon expiration of the second pulse application duration.

5. The method of claim 4, wherein the second voltage magnitude is less than the first voltage magnitude.

6. The method of claim 4, wherein the third pulse application duration is shorter than the second pulse application duration.

7. The method of claim 1, wherein iteratively modulating the at least one characteristic of the bias voltage includes repeatedly reversing the polarity of the bias voltage while reducing the voltage magnitude and the pulse application duration in subsequent iterations.

8. The method of claim 1, wherein iteratively modulating the at least one characteristic of the bias voltage includes repeatedly reversing the polarity of the bias voltage while increasing the voltage magnitude and the pulse application duration in subsequent iterations.

9. The method of claim 1, wherein determining whether the output signal satisfies the tuning criteria includes determining whether a bit rate of the output signal matches a target bit rate.

10. The method of claim 1, wherein determining whether the output signal satisfies the tuning criteria includes
   determining a rate of output events related to the random telegraph noise of the PMC;
   comparing the rate of the output events to a rate target; and
   determining that the output signal satisfies the tuning criteria in response to determining that the rate of the output is equal to or within a defined range of the rate target.

11. The method of claim 1, wherein the programmable metallization cell includes a non-volatile programmable metallization cell, and wherein the non-volatile programmable metallization cell is configured to continue to satisfy the tuning criteria after the bias voltage stimulus is removed.

12. A method of generating a random number using the random number generator system tuned according to the method of claim 1, the method further comprising:
   generating a random serial bit stream by converting the output signal from an individual PMC indicative of the random telegraph noise of the PMC into a frequency signal;
   periodically sampling the random serial bit stream; and
   storing a random output word including a series of periodically sampled bits from the random serial bit stream.

13. A method of generating a random number using the random number generator system tuned according to the method of claim 1, the method further comprising:
   monitoring an output from each PMC of a plurality of PMC devices in a PMC array; and
   storing a random output word including an output bit from each of the PMCs in the plurality of PMC devices in the PMC array.

14. A method of tuning a random number generator system to adjust a randomness characteristic, the random number generator system including at least one programmable metallization cell (PMC) and configured to provide a random output word based on random telegraph noise caused by the at least one PMC, the method comprising:
   monitoring an output signal of the PMC;
   determining whether the output signal satisfies tuning criteria; and
   iteratively modulating at least one stimulus applied to the PMC until the output signal satisfies the tuning criteria.

15. The method of claim 14, wherein iteratively modulating the at least one stimulus includes iteratively modulating at least one stimulus selected from a group consisting of a temperature stimulus and an optical stimulus.

16. A system comprising a plurality of programmable metallization cells (PMCs) configured in single device array, wherein
   a first subset of PMCs of the plurality of PMCs in the array are configured to generate a random number based on random telegraph noise caused by each PMC of the first subset of PMCs, and wherein the PMCs of the first subset of PMCs are tuned to satisfy defined randomness tuning criteria; and
   a second subset of PMCs of the plurality of PMCs in the array are configured to store data as memory storage elements.

* * * * *